US012804886B2

(12) United States Patent
Shang

(10) Patent No.: US 12,804,886 B2
(45) Date of Patent: Nov. 17, 2026

(54) SEMICONDUCTOR STRUCTURE AND METHOD OF MANUFACTURING THE SAME

(71) Applicant: NANYA TECHNOLOGY CORPORATION, New Taipei City (TW)

(72) Inventor: Kai-Po Shang, Taichung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 452 days.

(21) Appl. No.: 18/369,144

(22) Filed: Sep. 16, 2023

(65) Prior Publication Data

US 2025/0098150 A1 Mar. 20, 2025

(51) Int. Cl.

| | |
|---|---|
| ***H10W 20/46*** | (2026.01) |
| ***H10B 12/00*** | (2023.01) |
| ***H10W 20/00*** | (2026.01) |
| ***H10W 20/43*** | (2026.01) |

(52) U.S. Cl.

CPC ........... *H10B 12/482* (2023.02); *H10B 12/03* (2023.02); *H10W 20/072* (2026.01); *H10W 20/43* (2026.01); *H10W 20/46* (2026.01)

(58) Field of Classification Search

CPC .. H10B 12/482; H10B 12/03; H10B 12/0335; H10B 12/315; H10B 12/485; H10W 20/072; H10W 20/43; H10W 20/46; H10W 20/074; H10W 20/075; H10W 20/077; H10W 20/47

See application file for complete search history.

(56) References Cited

U.S. PATENT DOCUMENTS

| | | | | |
|---|---|---|---|---|
| 10,937,884 B1 * | 3/2021 | Wang | H10D 62/151 | |
| 11,226,552 B2 * | 1/2022 | Ahn | G03F 1/70 | |
| 2021/0296321 A1 | 9/2021 | Heo et al. | | |
| 2023/0144120 A1 * | 5/2023 | Chen | H10B 12/053 | 257/295 |
| 2023/0225111 A1 * | 7/2023 | Lee | H10B 12/0335 | 257/296 |

FOREIGN PATENT DOCUMENTS

CN 115188708 A 10/2022

* cited by examiner

*Primary Examiner* — Yara B Green
*Assistant Examiner* — Benjamin Michael Kupp
(74) *Attorney, Agent, or Firm* — CKC & Partners Co., LLC

(57) ABSTRACT

Provided is a method of manufacturing a semiconductor structure. The method includes the following steps. A substrate including active areas and insulation areas between the active areas is provided. A plurality of bit line structures are formed on a top surface of the substrate. A first oxide layer is deposited on each of the bit line structures. A spacer structure is deposited on the first oxide layer. Besides, the spacer structure is a multilayer structure and includes a second oxide layer. The first oxide layer and second oxide layer are removed to form a first air gap and a second air gap as a spacer. A plurality of landing pads is formed over the plurality of bit line structures and the first air gap and the second air gap. In addition, a semiconductor structure is also provided in this disclosure.

7 Claims, 18 Drawing Sheets

SEMICONDUCTOR STRUCTURE AND METHOD OF MANUFACTURING THE SAME

BACKGROUND

Field of Invention

The present disclosure relates to a semiconductor structure and a method of manufacturing the same. More particularly, the present disclosure relates to a semiconductor structure containing a bit line structure with a double-air-gap spacer and a method of manufacturing the same.

Description of Related Art

As electronic devices become lighter and thinner, semiconductor devices, such as dynamic random access memory (DRAM) become more highly integrated. Further, the performance of the DRAM is improved via shortening the pitch between the semiconductor structures in the DRAM. Due to shrinking the size of the semiconductor structure, in addition to increasing the difficulty of the manufacturing process, the components in the semiconductor structures are also prone to leakage resulting from too close distances.

As a result, in the semiconductor manufacturing process, how to reduce the leakage to improve the process yield of the semiconductor structure has become an important issue.

SUMMARY

Embodiments of this disclosure provide a method of manufacturing a semiconductor structure. The method includes the following steps. A substrate is provided. A plurality of bit line structures are formed on a top surface of the substrate. A first oxide layer is deposited on each of the bit line structures. A spacer structure is deposited on the first oxide layer. Besides, the spacer structure is a multilayer structure and comprises a second oxide layer. The first oxide layer and second oxide layer are removed to form a first air gap and a second air gap as a spacer. A plurality of landing pads is formed over the plurality of bit line structures and the spacer.

In some embodiments, a material of the first oxide layer and a material of the second oxide layer is the same.

In some embodiments, the first oxide layer and second oxide layer are removed simultaneously.

In some embodiments, depositing the spacer structure on the first oxide layer includes the following steps. A first nitride layer is formed on the first oxide layer. The second oxide layer is formed on the first nitride layer. A second nitride layer is formed on the second oxide layer.

In some embodiments, the method further includes the following steps. A first barrier layer is deposited over the substrate and covering the plurality of active areas and the plurality of insulation areas. A plurality of first openings of the first barrier layer extend through the substrate and exposing a portion of each of the active areas are formed after forming the first barrier layer. Also, a plurality of bit line contacts are formed in the first openings. Each of the bit line contacts is electrically connected to each of the active areas.

In some embodiments, wherein removing the first oxide layer and second oxide layer includes the following steps. The first oxide layer and the spacer structure in a lateral direction are removed after depositing the spacer structure.

In some embodiments, after removing the first oxide layer and second oxide layer, a spacer is formed. The spacer comprises the first air gap, the first nitride layer, the second air gap and the second nitride layer are arranged outward in sequence from each of the bit line structures.

In some embodiments, the first air gap comprises a first space and a second space. Moreover, the first space is formed between each of the bit line structures and a vertical portion of the first nitride layer in a lateral direction, and the second space is formed between a bottom surface of a lateral portion of first nitride layer and a top surface of the first barrier layer in a vertical direction.

In some embodiments, the second air gap comprises a third space and a fourth space. Moreover, the third space is formed between the a vertical portion of first nitride layer and the second nitride layer in a lateral direction, and the fourth space is formed between a top surface of a lateral portion of first nitride layer and a bottom surface of the second nitride layer in a vertical direction.

In some embodiments, forming the plurality of landing pads includes the following steps. A fourth conductive layer is deposited on the barrier layer and covers each of the bit line structures. A plurality of third openings is formed by removing a portion of the fourth conductive layer.

In some embodiments, the method further includes the following step. A sealing layer is formed on each of the landing pads and the spacer and filling in the plurality of third openings.

In some embodiments, after forming the sealing layer, the first air gap has a fourth height in a vertical direction, and the second air gap has a fifth height in the vertical direction. The fourth height is measured form a surface of the sealing layer against the first air gap to a top surface of the first barrier layer, and the fifth height is measured from a surface of the sealing layer against the second air gap to a top surface of a lateral portion of the first nitride layer. The fourth height is greater than the fifth height.

Embodiments of this disclosure provide a semiconductor structure. The semiconductor structure includes a substrate, a plurality of bit line structures, a spacer and a plurality of landing pads. A substrate includes a plurality of active area and a plurality of insulation areas. The bit line structures are disposed on and protrude from the substrate. The spacer is disposed surrounding a sidewall of each of the plurality of bit line structures. Besides, the spacer includes a first air gap, a first nitride layer, a second air gap and a second nitride layer arranged outward in sequence from each of the bit line structures. The landing pads are disposed over the plurality of bit line structures with the spacer.

In some embodiments, the first air gap includes a first space and a second space. Moreover, the first space is disposed between a vertical portion of the first nitride layer and the first air gap in a lateral direction, and the second space is disposed between a lateral portion of the first nitride layer and the first barrier layer in a vertical direction.

In some embodiments, the first space has a first distance, and the second space has a second distance. The first distance is associated with the second distance.

In some embodiments, the second air gap comprises a third space and a fourth space. Moreover, the third space is disposed between a vertical portion of the first nitride layer and the second nitride layer in a lateral direction, and the fourth space is disposed between the second nitride and a lateral portion of the first nitride layer in a vertical direction.

In some embodiments, the third space has a third distance, and the fourth space has a fourth distance. The third distance is associated with the fourth distance.

In some embodiments, each of the plurality of bit line structures includes a bottom cap layer, a conductive layer and a top cap layer. The bottom cap layer is disposed over the substrate. The conductive layer is disposed on the bottom cap layer. The top cap layer is disposed on the conductive layer.

In some embodiments, the bottom cap layer has a first height, the conductive layer has a second height, and the top cap layer has a third height. The third height is greater than the second height, and the second height is greater than the first height.

In some embodiments, the semiconductor structure further includes a sealing layer disposed on the landing pads and the spacer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The disclosure can be more fully understood by reading the following detailed description of the embodiment, with reference made to the accompanying drawings as follows.

DETAILED DESCRIPTION

Figure 1:
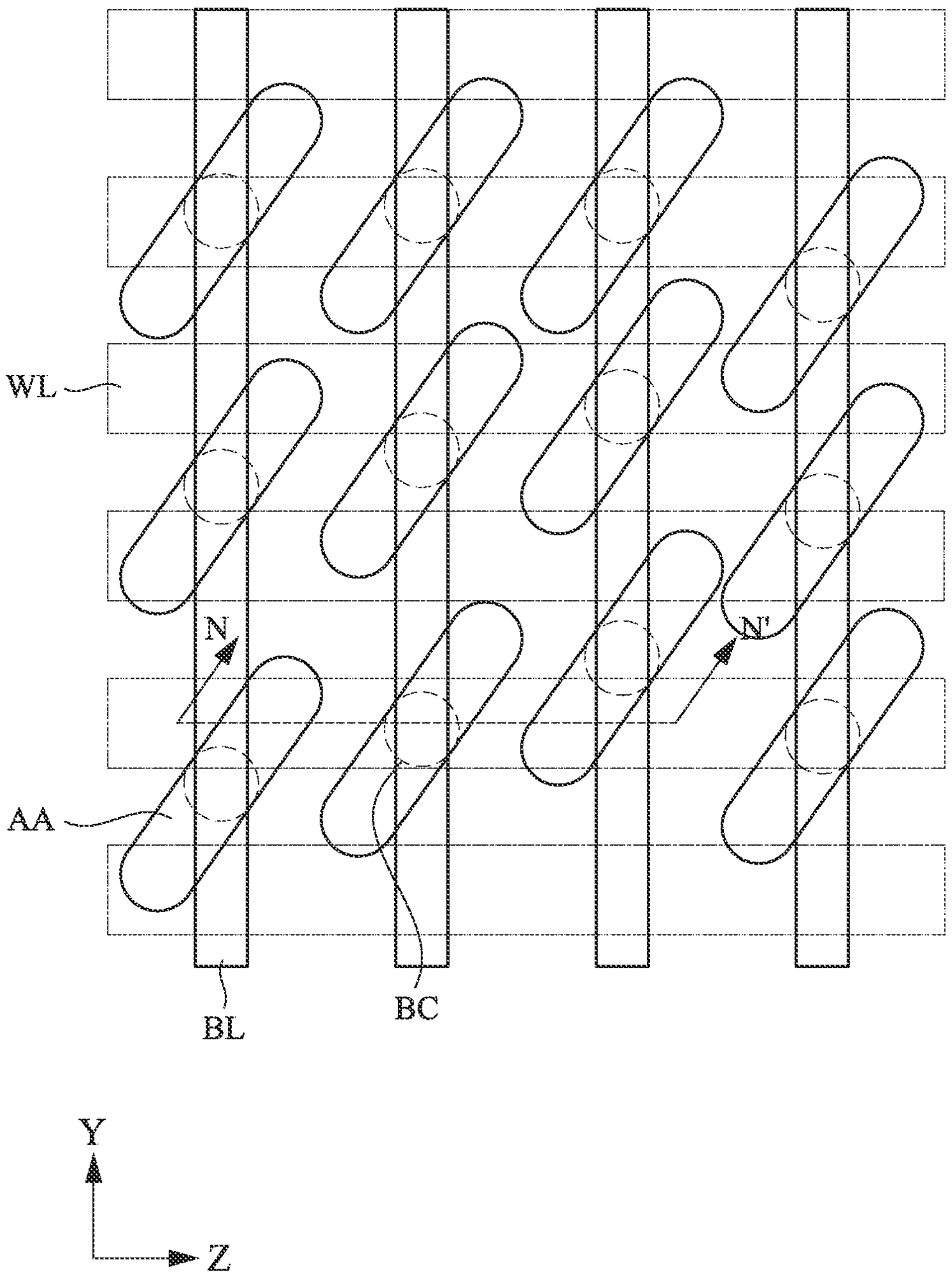
FIGS. 1-7 are views of a method of manufacturing a semiconductor structure during forming a first air gap and a second air gap according some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprise", "include", "have", "contain" and the like used in the present disclosure are open terms, meaning including but not limited to.

As DRAM technology node continues to scale, the conductive structures in DRAM devices are getting closer. In this way, a parasitic capacitance between the conductive structures, such as a bit line structure and a cell contact, is increased, which reduces the operation speed of the DRAM device. In order to solve the problem of the parasitic capacitance, the present disclosure provides a semiconductor structure and a method of manufacturing the same through introducing a bit line structure with a double-air-gap spacer into DRAM, so as to minimize the problem of the operation speed of the DRAM caused by the parasitic capacitance.

It should be noted that when the following figures, such as FIGS. 1 to 16, are illustrated and described as a series of operations or steps, the description order of these operations or steps should not be limited. For example, some operations or steps may be undertaken in a different order than in the present disclosure, or some operations or steps may occur currently, or some operations may not be used, and/or some operations or steps may be repeated. Moreover, the actual operations or steps of process stages may require additional operations or steps before, during or after forming the semiconductor structure (for example, a semiconductor structure 100 in FIG. 16) to completely form the semiconductor structure 100. Therefore, the present disclosure may briefly illustrate some of these additional operations or steps. Further, unless otherwise stated, the same explanations discussed for the following figures, such as FIGS. 1 to 15, apply directly to the other figures.

Please refer to FIGS. 1-7. FIGS. 1-7 are views of a method of manufacturing a semiconductor structure during forming a first air gap 152A and a second air gap 156A according some embodiments of the present disclosure, wherein FIG. 1 is a top view of a semiconductor structure with a plurality of active areas 110 and a plurality of insulation areas 120 and according some embodiments of the present disclosure, and FIGS. 2-6 are cross-sectional views taken along a section-line NN' of FIG. 1 during one of forming the first air gap 152A and the second air gap 156A according some embodiments of the present disclosure, respectively.

Figure 2:
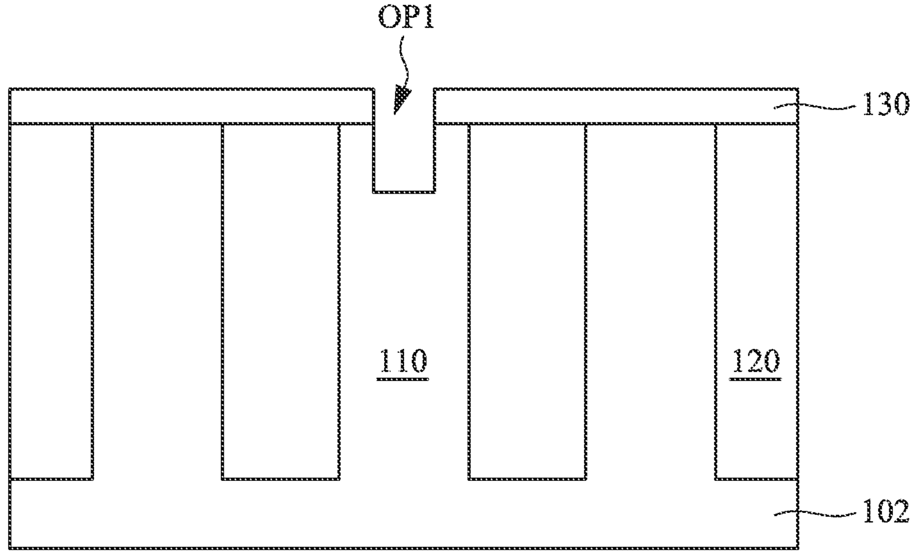

As shown in FIG. 2, a substrate 102 is provided. The substrate 102 includes the active area 110 and the insulation areas 120, and each of the insulation areas 120 is disposed between the active areas 110. In some embodiments, the substrate 102 may include silicon, such as crystalline silicon, polycrystalline silicon, or amorphous silicon. The substrate 102 may include an elemental semiconductor, such as germanium. In some embodiments, the substrate 102 may include alloy semiconductors, such as silicon germanium, silicon germanium carbide, gallium indium phosphide, or other suitable materials. In some embodiments, the substrate 102 may include compound semiconductors, such as silicon carbide (SiC), gallium arsenide (GaAs), indium phosphide (InP), indium arsenide (InAs), or other suitable materials. Besides, in some embodiments, the 102 substrate can optionally have a semiconductor-on-insulator (SOI) structure.

Next, after the active areas 110 and the insulation areas 120 are formed, a first barrier layer 130 is formed on the top surface of the substrate 102 and covers the active areas 110 and the insulation areas 120. Further, a patterning process is performed on the first barrier layer 130 to form a plurality of first openings OP1 in the first barrier layer 130. Also, each of the first openings OP1 exposes a portion of each of the active areas 110. It should be mentioned that the number of the first opening OP1 illustrated in FIG. 2 is one, but the present disclosure is not limited thereto.

Figure 3:
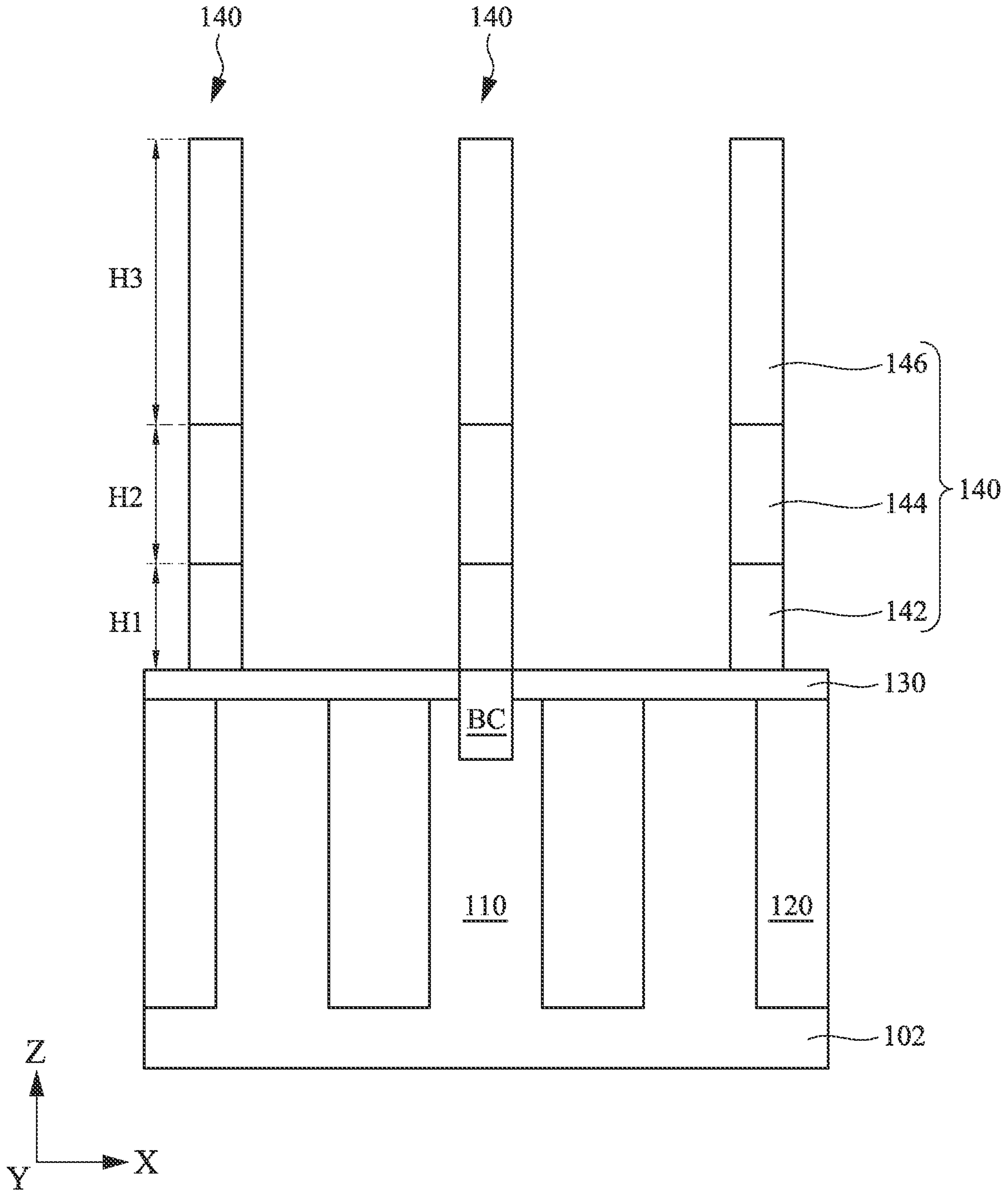

Then, as shown in FIG. 3, a plurality of bit line structures 140 are formed over the substrate 102. After forming the openings OP1 in the first barrier layer 130, a first conductive material is filled in each of the first openings OP1 to form a bit line contact BC. The bit line contact BC contacts the portion of each of the active areas 110, and the bit line contact BC is electrically connected to each of the active areas 110, especially a source region (not shown). It should be mentioned that the number of the bit line contact BC illustrated in FIG. 3 is one, but the present disclosure is not limited thereto.

Further, the bit line structures 140 are formed on the first barrier layer, and the bit line structures 140 protrude from the substrate 102, such as along the Z direction as shown in FIG. 3. In some embodiments, one of the bit line structures 140 and another one of the bit line structures 140 are spaced apart from each other over the substrate 102 by substantially equal intervals. Each of the bit line structures 140 may be divided into three parts along a direction substantially perpendicular to the substrate 102 (for example, the Z direction). One part is a bottom cap layer 142 which is closed to the substrate 102, another part is a conductive layer 144 on the bottom cap layer 142, and the other part is a top cap layer 146 on the conductive layer 144. Moreover, the number of the bit line structures 140 illustrated in FIG. 3 is 3, but the present disclosure is not limited thereto.

The manners for forming the bottom cap layer 142, the conductive layer 144 and the top cap layer 146 is described as follow. A first insulation material is deposited on the first barrier layer 130, a second conductive material is deposited on the first insulation material, and a second insulation material is deposited on the second conductive material. Next, the first insulation material, the second conductive material and the second insulation material may be etched substantially simultaneously in some embodiments, so as to form the bottom cap layer 142, the conductive layer 144 and the top cap layer 146 at the same time. Accordingly, each of the bit line structures 140 containing the bottom cap layer 142, the conductive layer 144 and the top cap layer 146 may be spaced apart from each other in a first direction (such as the X direction in FIG. 4) and extend in a second direction (such as the Y direction in FIG. 4) parallel to each other. In some embodiments, the bottom cap layer 142, the conductive layer 144 and the top cap layer 146 are not etched simultaneously. In these embodiments, the second insulation material is first etched into a desired pattern. Next, the second conductive material and the first insulation material are etched to form the conductive layer 144 and the bottom cap layer 142, respectively, by using the patterned second insulation material as an etching mask for the conductive material and the first insulation material.

In some embodiments, the first insulation material and the second insulation material are the same or different. In some embodiments, the first insulation material includes a dielectric material, such as silicon nitride, but the present disclosure is not limited thereto. In some embodiments, the second insulation material includes a dielectric material, such as silicon nitride, but the present disclosure is not limited thereto.

In some embodiments, the second conductive material of the conductive layer 144 may be at least one of doped semiconductor, metal, conductive metal nitride and metal silicide. In some embodiments, the conductive layer 144 may have a stacked structure. For example, the second conductive material may be a stack structure composed of doped polysilicon and metal nitride or metal (such as tungsten, tungsten nitride and/or titanium nitride). Besides, the conductive layer 144 may be electrically connected to the bit line contact BC.

It should be noted that, the bottom cap layer 142, the conductive layer 144 and the top cap layer 146 are collectively referred to as each of the bit line structures 140. In some embodiments, the bottom cap layer 142 has a first height H1, and the third height H1 is a vertical height along the Z direction of the bottom cap layer 142. The conductive layer 144 has a second height H2, and the second height H2 is a vertical height along the Z direction of the conductive layer 144. As well, the top cap layer 146 has a third height H3, and the third height H3 is a vertical height along the Z direction of the top cap layer 146. In some embodiments, the third height H3 is greater than the second height H2. Also, the second height H2 is greater than the first height H1.

Figure 4:
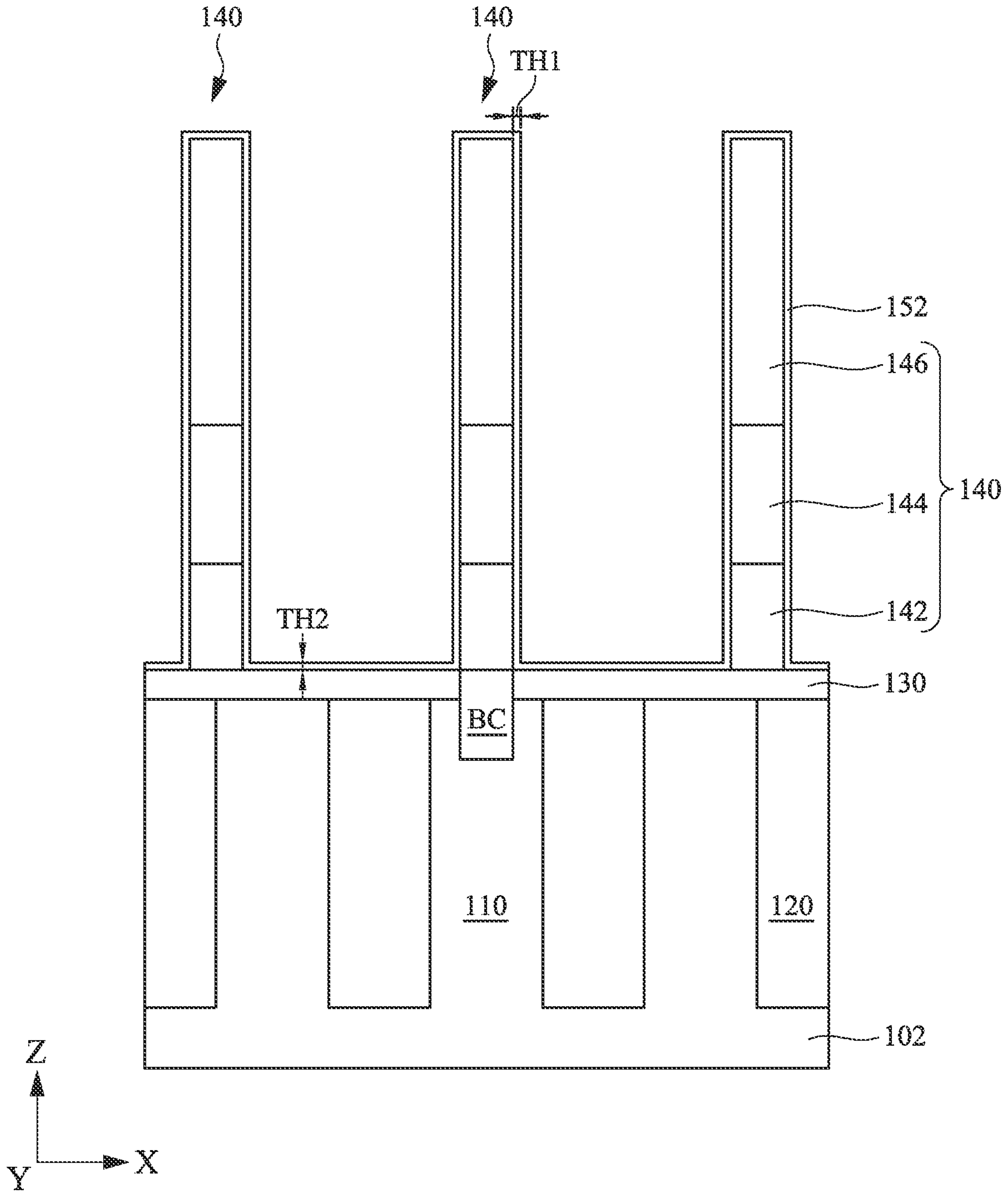

Next, please refer to FIG. 4. A first oxide layer 152 is deposited on each of the bit line structures 140 and the first barrier layer 130. Specifically, the first oxide layer 152 extends along the sidewalls each of the bit line structures 140. In some embodiments, the material of the first oxide layer 152 includes oxide, such as silicon oxide or other suitable oxide, and the present disclosure is not limited thereto. Additionally, the first oxide layer 152 on the sidewall of each of the bit line structures 140 has a first thickness TH1, that is, the first oxide layer 152 in the Z direction has the first thickness TH1. The first oxide layer 152 on the top surface of each of the bit line structures 140 and the first barrier layer 130 has a second thickness TH2, that is, the first oxide layer 152 in the lateral direction (such as X direction and Y direction) has the second thickness TH2. Understandably, in some embodiments, the first thickness TH1 is associated with the second thickness TH2. For example, the third thickness TH1 is equivalent to the fourth thickness TH2. The first oxide layer 152 may serve as a sacrificial layer and be transformed into an air gap in a subsequent process.

Figure 5:
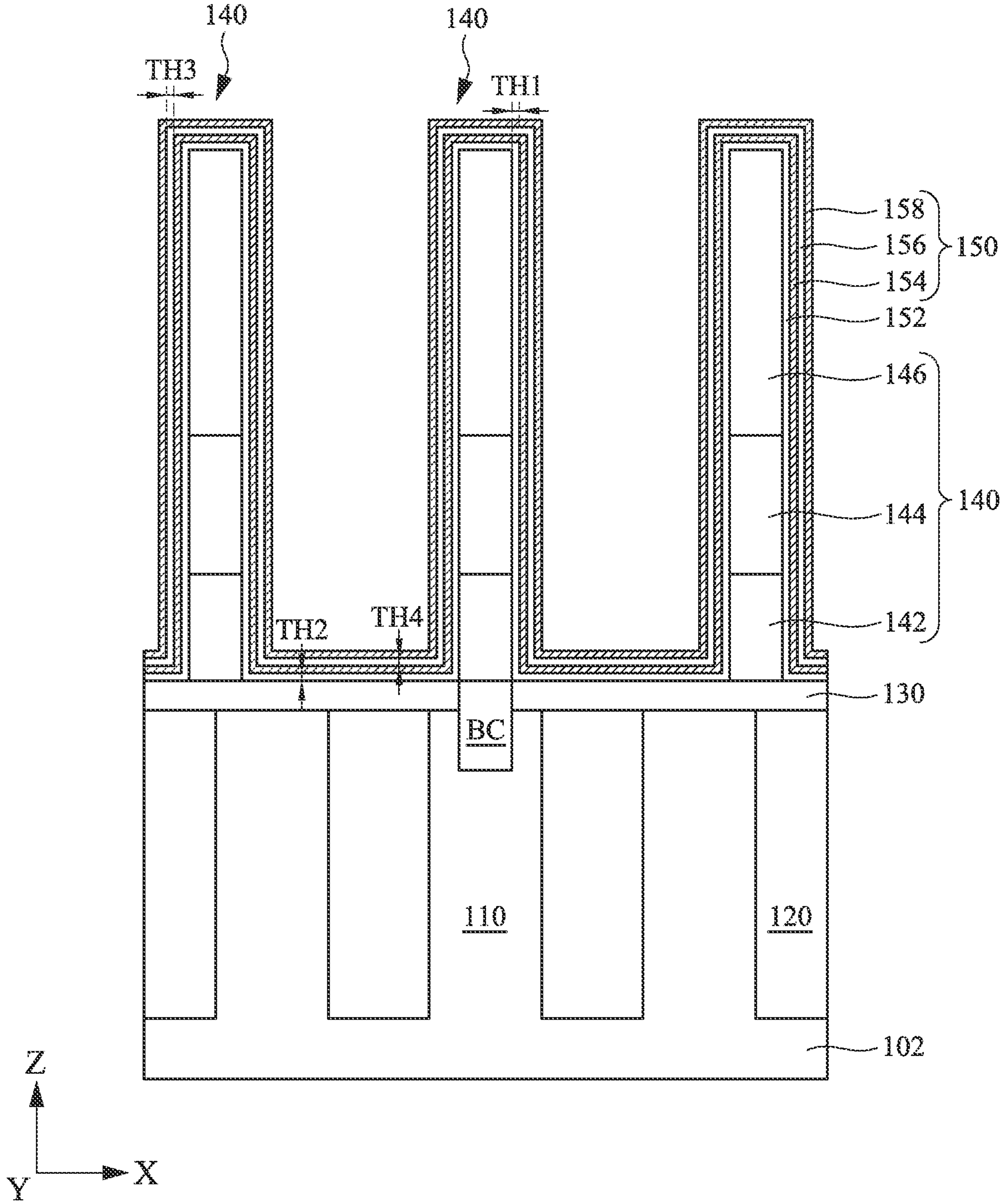

Further, please refer to FIG. 5. A spacer structure 150 is formed on the first oxide layer 152 and over each of the bit line structures 140. Specifically, the spacer structure 150 surrounds the sidewalls and the top surface each of the bit line structures 140. The spacer structure 150 is a multilayer structure, which includes a first nitride layer 154, a second oxide layer 156 and a second nitride layer 158 formed on the first oxide layer 152 arranged outward in sequence from each of the bit line structures, especially from the first oxide layer 152. In some embodiments, a material of the first nitride layer 154 and the second nitride layer 158 are the same or different. In some embodiments, the material of the first nitride layer 154 includes silicon nitride. In some embodiments, the material of the second nitride layer 158 includes silicon nitride. In some embodiments, the material of the second oxide layer 156 includes an oxide, such as silicon oxide or other suitable oxides, and the present disclosure is not limited thereto.

Additionally, the second oxide layer 156 on the sidewall of each of the bit line structures 140 has a third thickness TH3, that is, the second oxide layer 156 in the Z direction has the third thickness TH3. The second oxide layer 156 on the top surface of each of the bit line structures 140 and the first barrier layer 130 has a fourth thickness TH4, that is, the second oxide layer 156 in the lateral direction (such as X direction and Y direction) has the fourth thickness TH4. Understandably, in some embodiments, the third thickness TH3 is associated with the fourth thickness TH4. For example, the third thickness TH3 is equivalent to the fourth thickness TH4. It is worth to mention that the first thickness TH1 and the third thickness TH3 are the same or different, and the second thickness TH2 and the fourth thickness TH4 are the same or different. Also, the second oxide layer 156 between the first nitride layer 154 and the second nitride layer 158 is a sacrificial layer and transformed into another air gap in the subsequent process, and the related descriptions will be described in the following content.

In some embodiments, the spacer structure 150 with the first nitride layer 154, the second oxide layer 156 and the second nitride layer 158 may be formed by the suitable deposition process such as chemical vapor deposition (CVD) process, atomic layer deposition (ALD) process, physical vapor deposition (PVD) process, other suitable deposition processes or any combination thereof.

Figure 6:
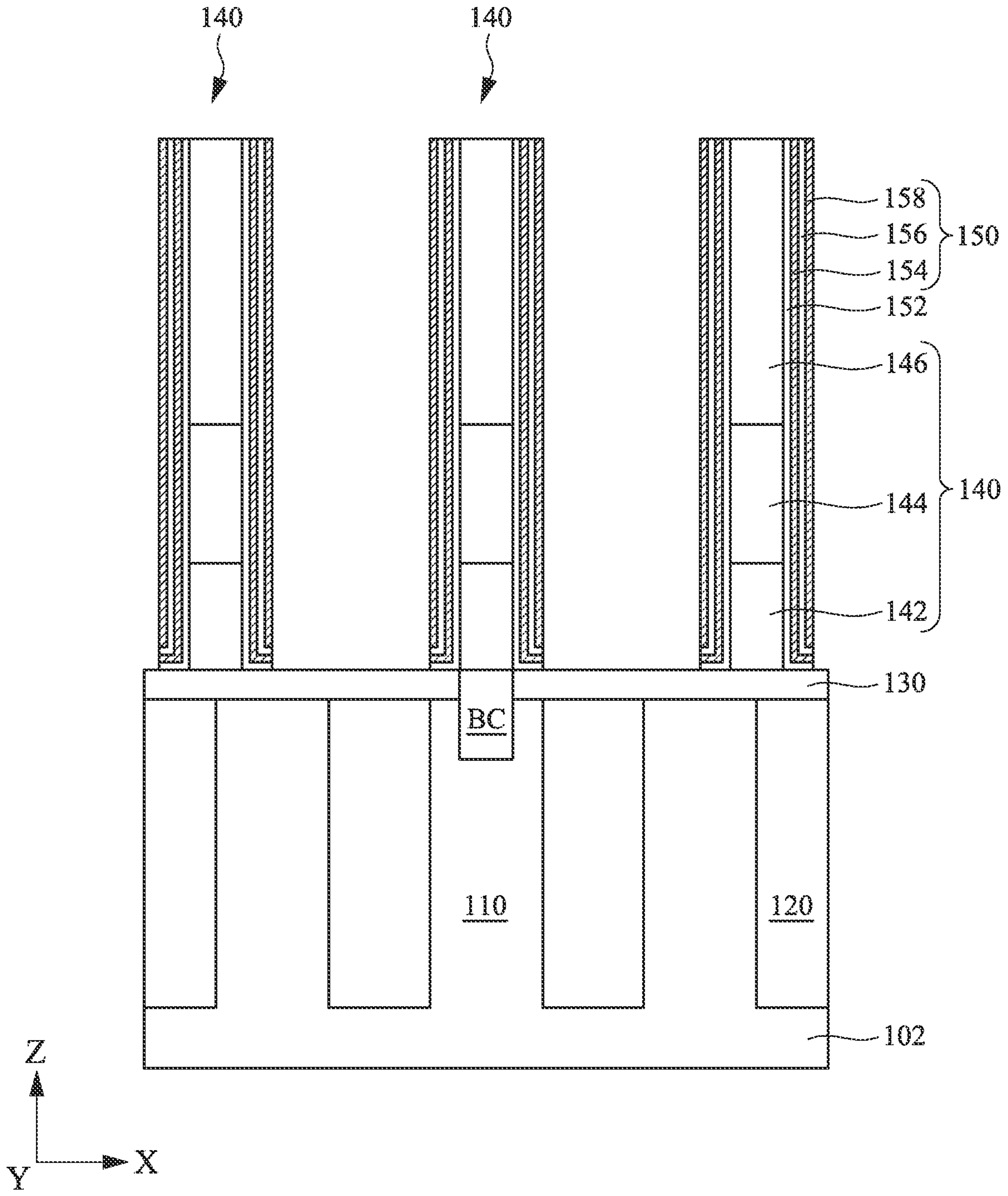

Next, refer to FIG. 6. The first oxide layer 152 and the spacer structure 150 in the lateral direction (such as X direction and Y direction) are removed. More specifically, the first oxide layer 152 and the spacer structure 150 on a top surface of each of the bit line structures 140 and on a top surface of the first barrier layer 130 are removed in the same removing process. In some embodiments, the removing process is performed through any suitable etching process, such as a reactive ion etching (RIE) process. Alternatively, in some embodiment, the removing process is performed through a planarization process, such as a chemical mechanical planarization (CMP) process.

Figure 7:
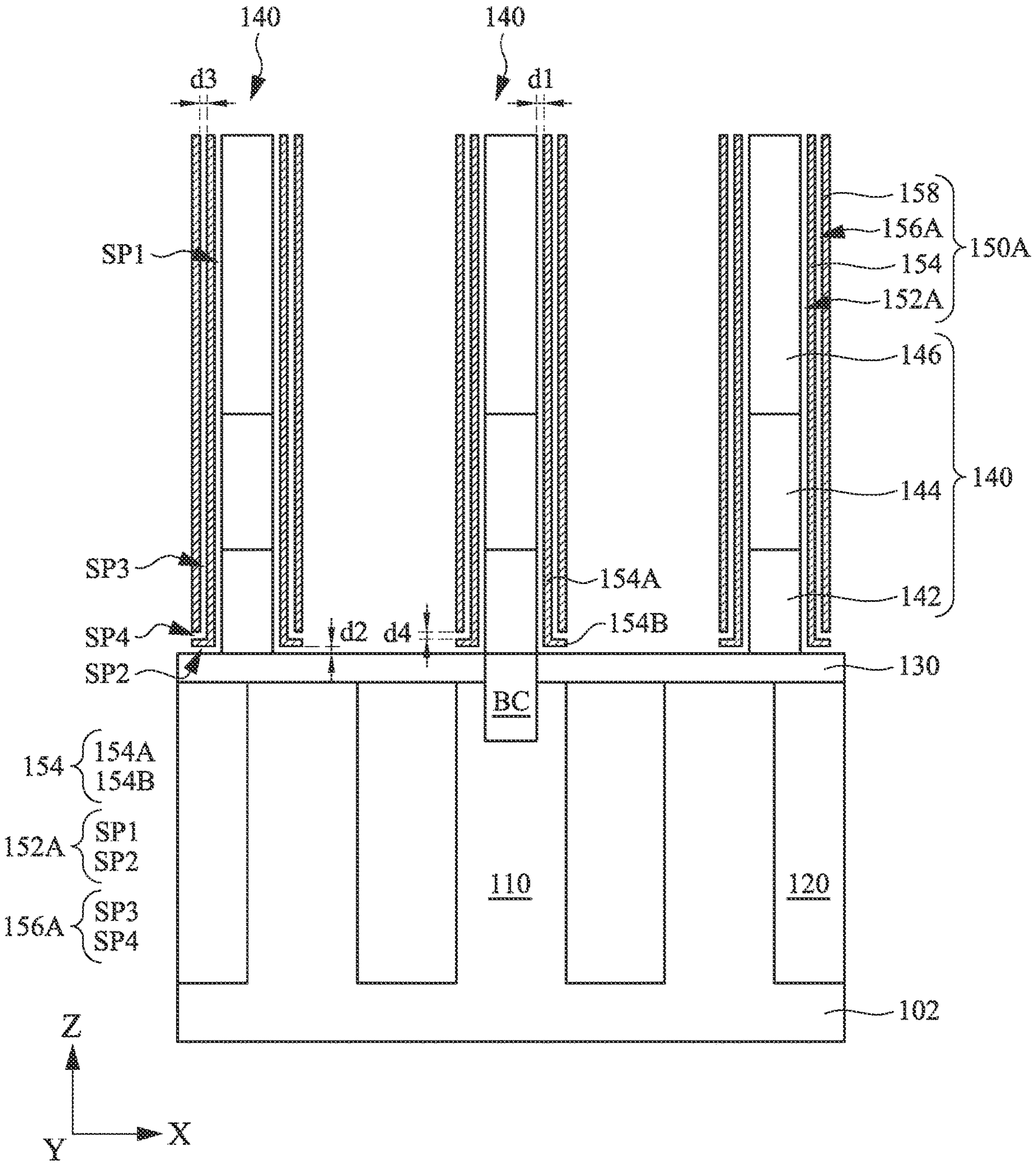

Then, please refer to FIG. 7. The first air gap 152A and the second air gap 156A are formed by an etching process. The first oxide layer 152 and the second oxide layer 156 are removed in the same etching process. Thus, the first oxide layer 152 and the second oxide layer 156 have etching selectivity relative to the first nitride layer 154 and the second nitride layer 158. That is, in the same etching process, an etching rate of the first oxide layer 152 and the second oxide layer 156 are faster than an etching rate of the first nitride layer 154 and the second nitride layer 158. Therefore, after etching process of the first oxide layer 152 and the second oxide layer 156, the first air gap 152A is formed between each of the bit line structures 140 and the first nitride layer 154, and the second air gap 156A is formed between the first nitride layer 154 and the second nitride layer 158. It is worth to mentioned that the first air gap 152A, the first nitride layer 154, the second air gap 156A and the second nitride layer 158 are collectively referred to as a "double-air-gap spacer 150A." In some embodiments, the etching process of forming the first air gap and the second air gap is a dry etching process, such as a gas phase etching process.

As shown in FIG. 7, to conveniently describe, the first nitride layer 154 includes a vertical portion 154A of the first nitride layer 154 and a lateral portion 154B of the first nitride layer. After forming the first air gap 152A and the second air gap 156A, the first air gap 152A includes a first space SP1 and a second space SP2. Further described, the first space SP1 is disposed between each of the bit line structures 140 and the vertical portion 154A of the first nitride layer 154, and there is a first distance d1 between each of the bit line structures 140 and the vertical portion 154A of the first nitride layer 154. The second space SP2 is disposed between a bottom surface of the lateral portion 154B of the first nitride layer 154 and the top surface of the first barrier layer 130, and there is a second distance d2 between the bottom surface of the lateral portion 154B of the first nitride layer 154 and the top surface of the first barrier layer 130.

The second air gap 156A includes a third space SP3 and a fourth space SP4. Further described, the third space SP3 is disposed between the vertical portion 154A of the first nitride layer 154 and the second nitride layer 158, and there is a third distance d3 between the vertical portion 154A of the first nitride layer 154 and the second nitride layer 158. The second space SP4 is disposed between the second nitride layer 158 and the top surface of the lateral portion 154B of the first nitride layer 154, and there is a fourth distance d4 between the second nitride layer 158 and the top surface of the lateral portion 154B of the first nitride layer 154.

In some embodiments, the first distance d1 is associated with the second distance d2. For example, the first distance d1 is equivalent to the second distance d2. In some embodiments, the third distance d3 is associated with the fourth distance d4. For example, the third distance d3 is equivalent to the fourth distance d4. Understandably, in some embodiments, the first distance d1 is associated with the first thickness TH1, while the third distance d3 is associated with the third thickness TH3. Besides, the second distance d2 is associated with the second thickness TH2, while the fourth distance d4 is associated with the fourth thickness TH4.

Figure 8:
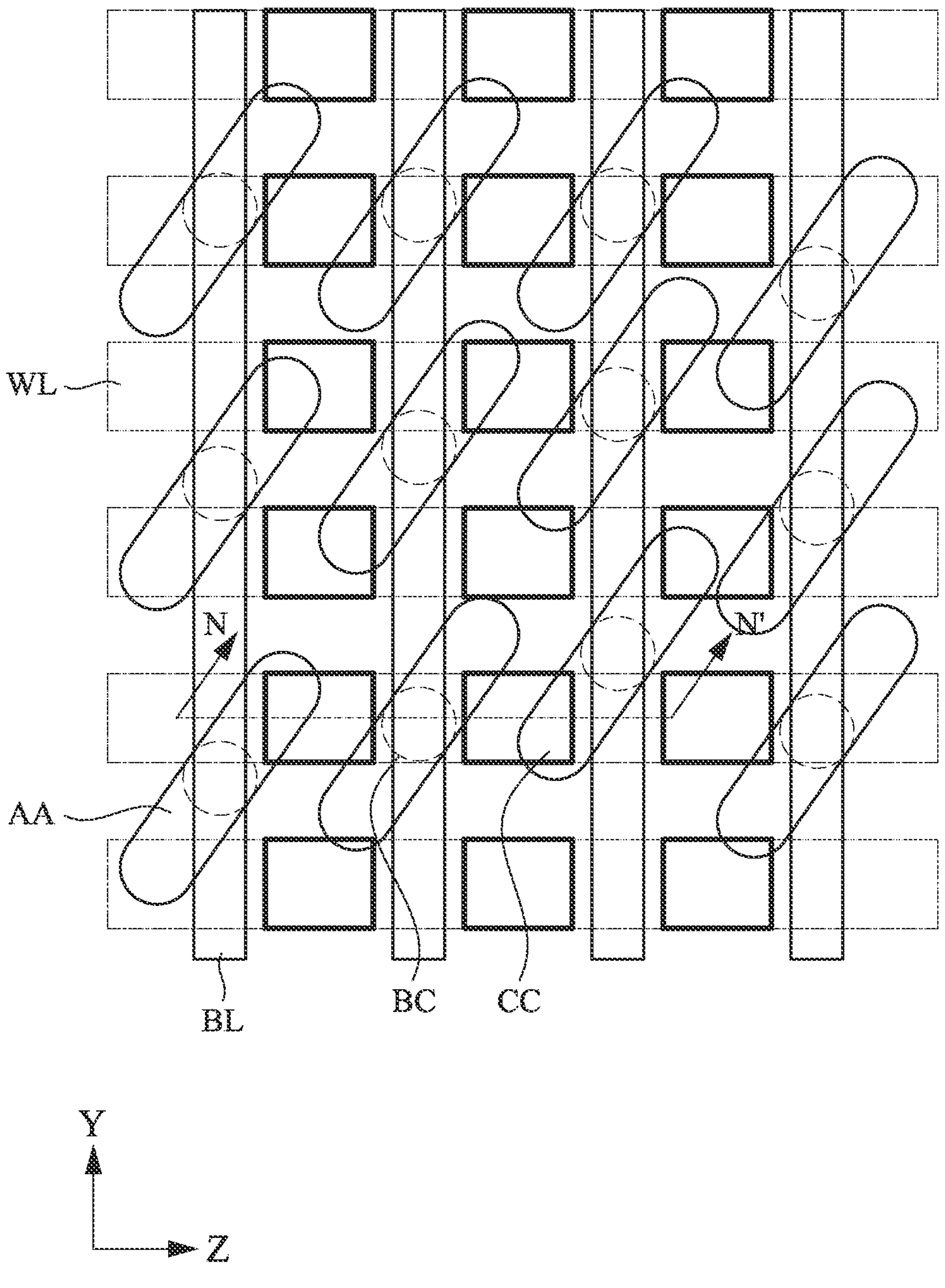
FIGS. 8-12 are views of a method of manufacturing a semiconductor structure during forming a plurality of cell contacts according some embodiments of the present disclosure.
Figure 9:
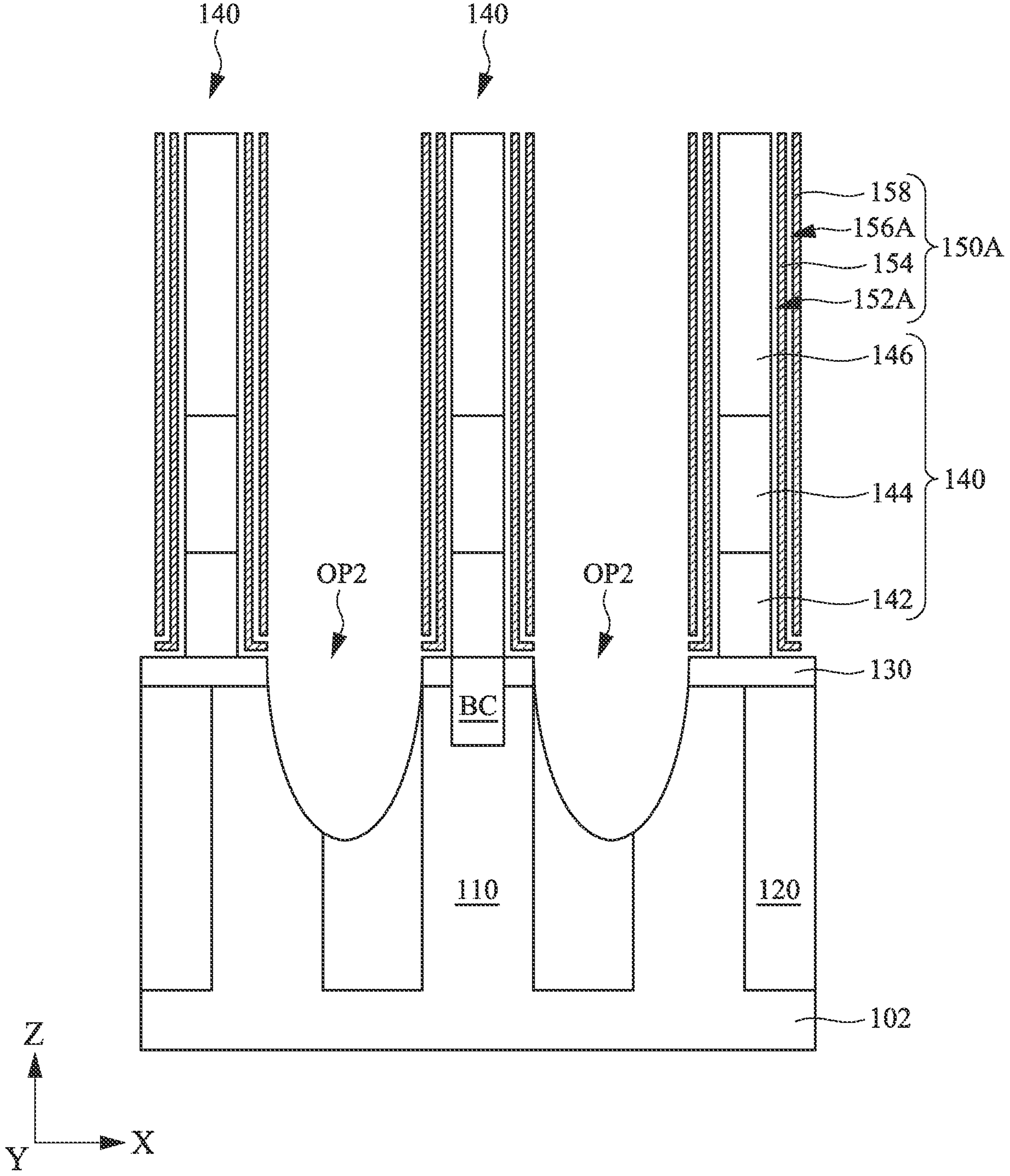
Figure 10:
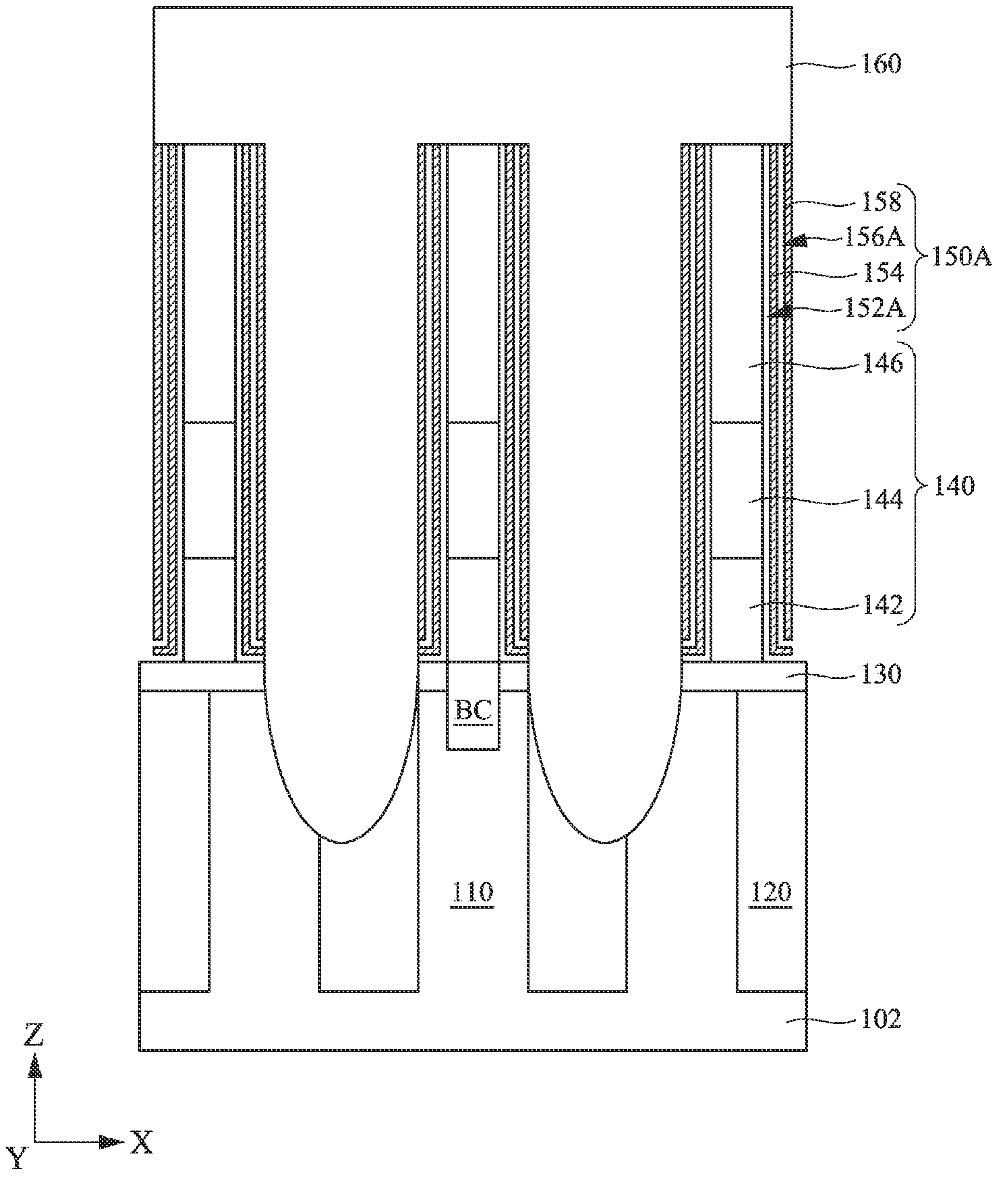
Figure 11:
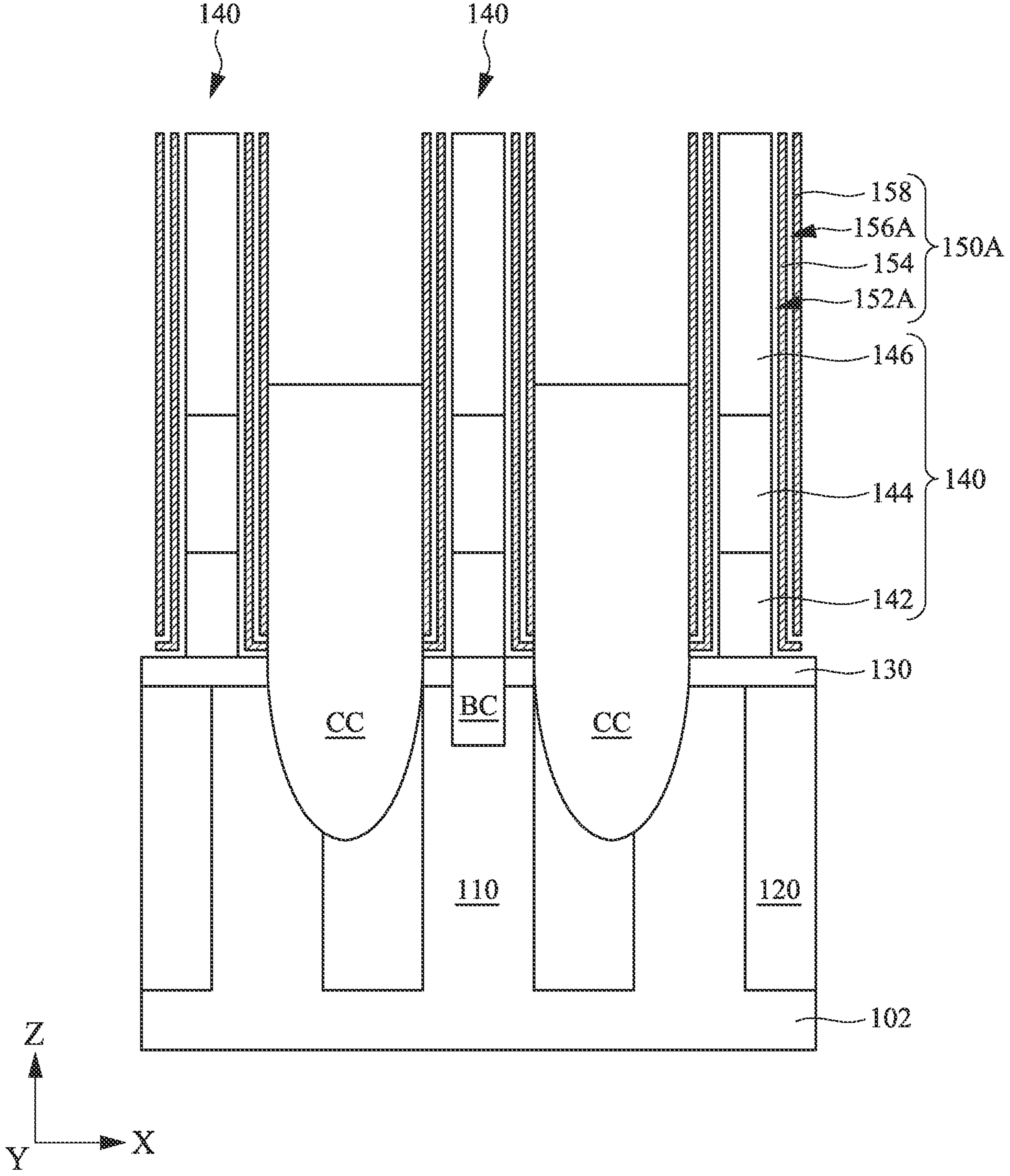

Further, please refer to FIGS. 8-11. FIGS. 8-11 are views of a method of manufacturing a semiconductor structure during forming a plurality of cell contacts CC according some embodiments of the present disclosure, wherein FIG. 8 is a top view of a semiconductor structure 100 with the cell contacts CC according some embodiments of the present disclosure, and FIGS. 9-11 are cross-sectional views taken along a section-line NN' of FIG. 8 during one of forming the cell contacts CC according some embodiments of the present disclosure, respectively.

Please refer to FIG. 9. A plurality of second openings OP2 are formed between the adjacent bit line structures 140 after forming the first air gap 152A and the second air gap 156A. It should be noted that the second openings OP2 is deep enough to expose a portion of each of the active areas 110. The second openings OP2 are formed by an etching process, such as dry etching process, but the present disclosure is not limited thereto. It is worth to mention that the number of the second openings OP2 illustrated in FIG. 9 is 2, but the present disclosure is not limited thereto.

Next, please refer to FIG. 10. A conductive material layer 160 is deposited in the second openings OP2 and covers each of the bit line structures 140 after forming the second openings OP2. In some embodiments, the conductive material layer 160 includes silicon, for example, a material of the conductive material layer 160 includes doped polysilicon. In some embodiments, the material of the conductive material layer 160 may include semiconductor materials, doped semiconductor materials, metals, metal nitrides, metal silicide, other suitable conductive materials or any combination thereof.

Then, please refer to FIGS. 8 and 11. The plurality of cell contacts CC are formed in the second openings OP2. In more detail, a portion of the conductive material layer 160 is removed to expose an upper portion of the double-air-gap spacer 150A and an upper portion of each of the bit line structures 140. In some embodiments, the portion of the conductive material layer 160 is removed by an etching back process, such as dry etch-back process, to form the cell contacts CC between the adjacent bit line structures. Specifically, each of the cell contacts CC is formed on the opposite sites of the conductive layer 144 of the bit line structures 140. In some embodiments, an etching process, such as an RIE process, is performed during removing the portion of the conductive material layer 160 to form the cell contacts CC. Also, although the number of the cell contacts CC illustrated in FIG. 11 is 2, the present disclosure is not limited thereto.

Figure 12:
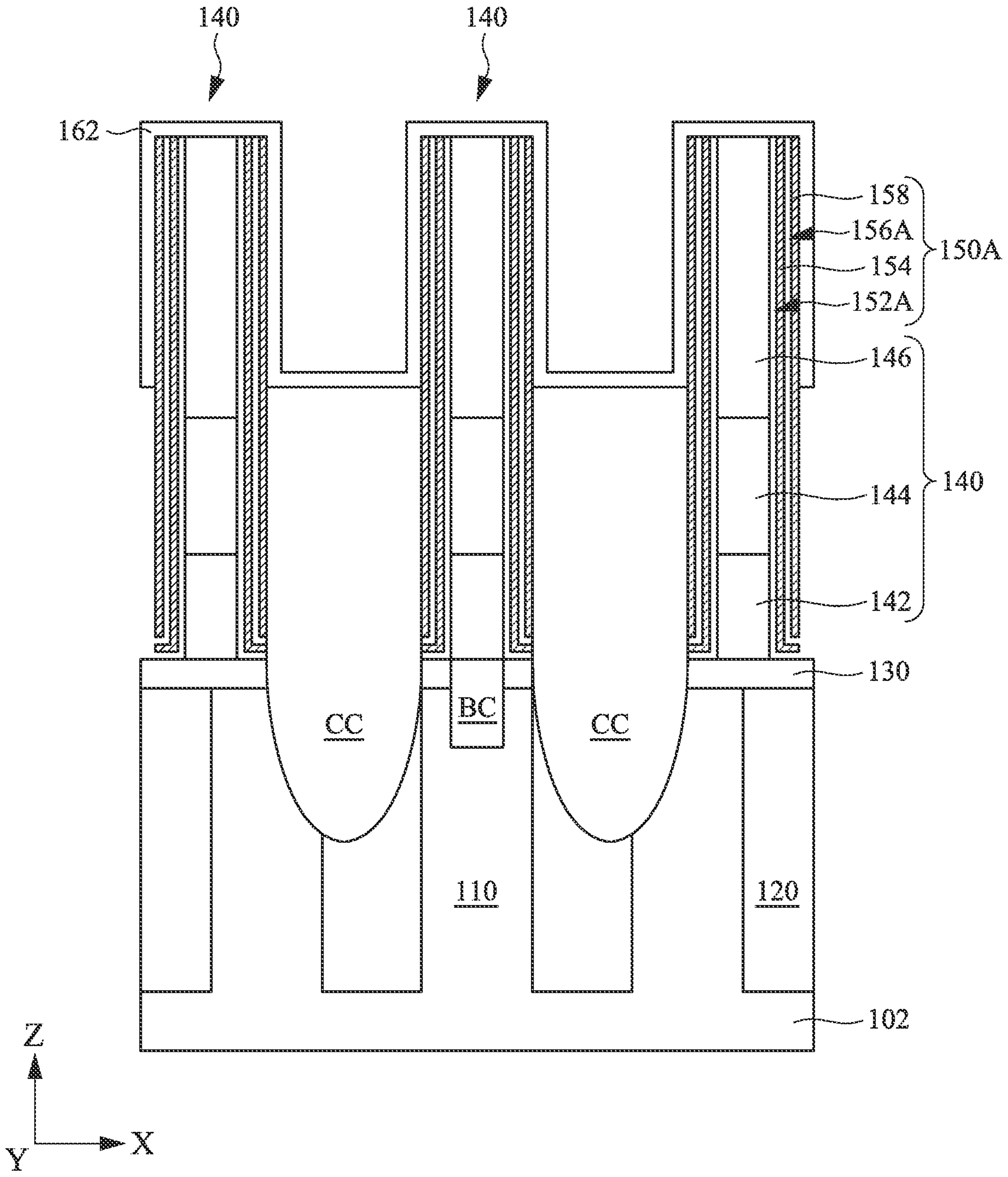
Figure 13:
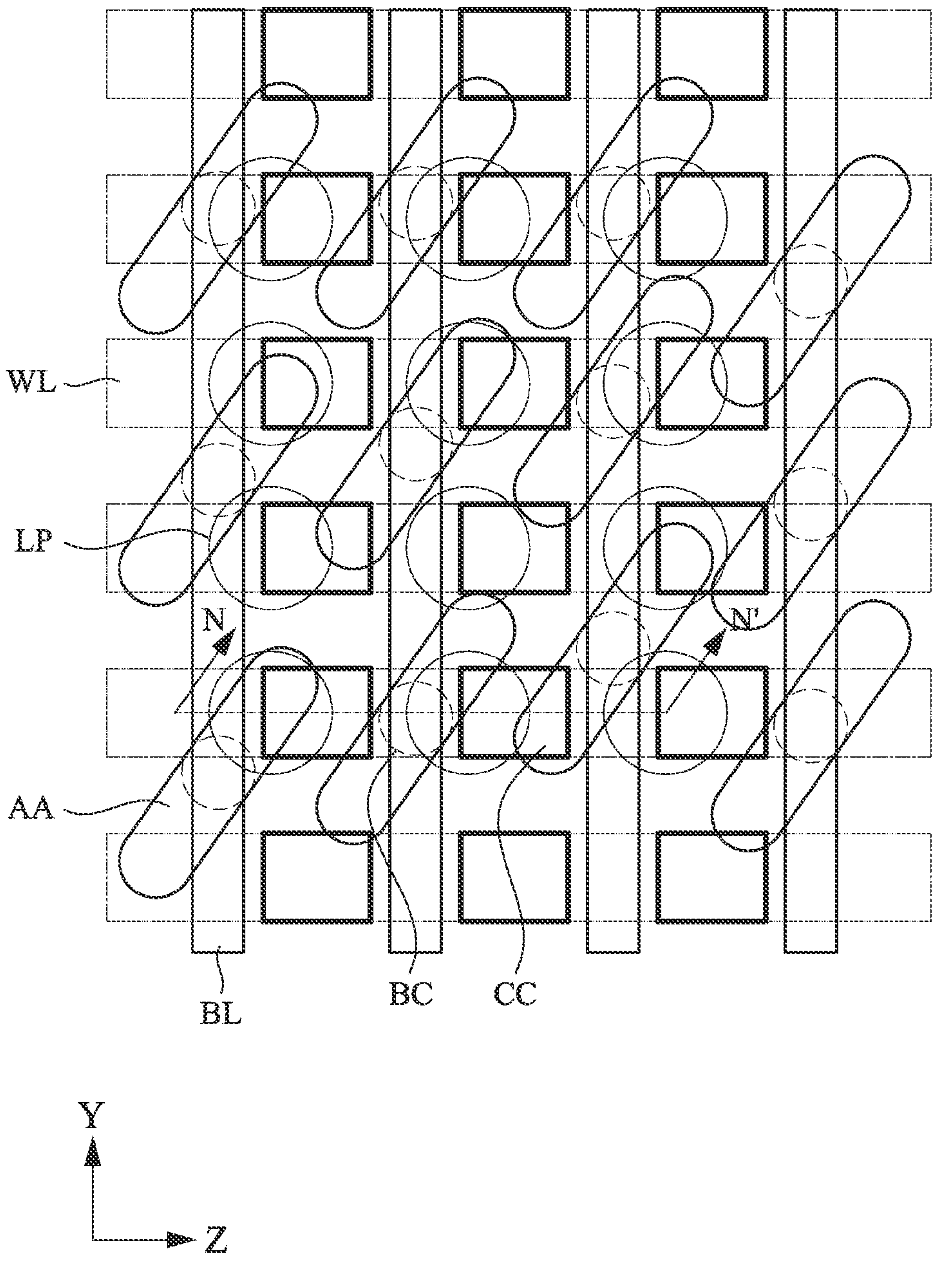
FIGS. 13-16 are views of a method of manufacturing a semiconductor structure during forming a plurality of landing pads according some embodiments of the present disclosure.

Next, please refer to FIG. 12. A second barrier layer 162 is formed on each of the bit line structures 140. In more detail, the second barrier layer 162 is formed on a top surface of each of the cell contacts CC and surrounds an upper portion of the double-air-gap spacer 150A. In some embodiments, a material of the second barrier layer 162 may include metal, such as titanium, tantalum or the like, metal nitride, such as titanium nitride, tantalum nitride or the like, or a combination thereof. In some embodiments, the second barrier layer may include titanium nitride.

Figure 14:
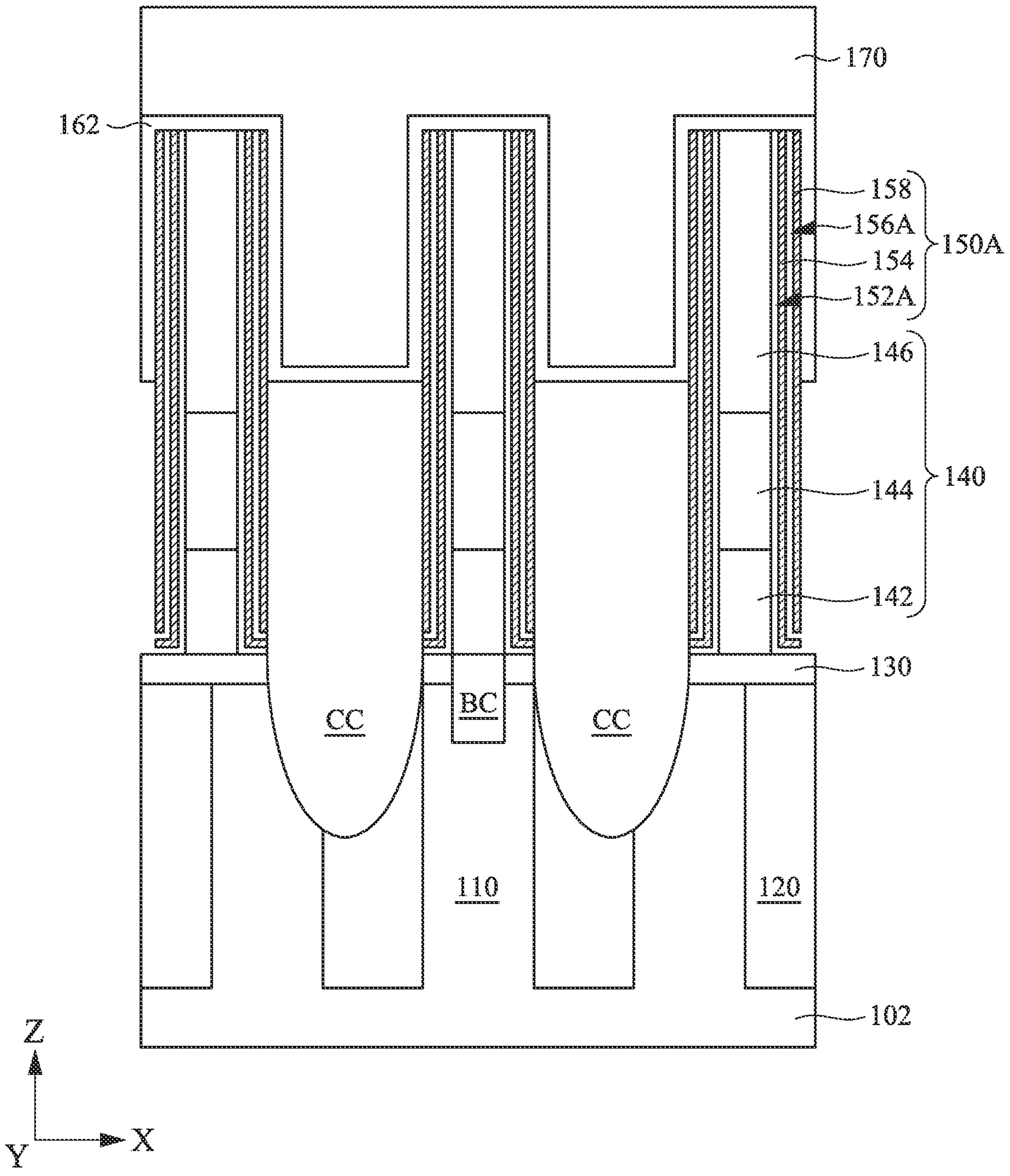
Figure 15:
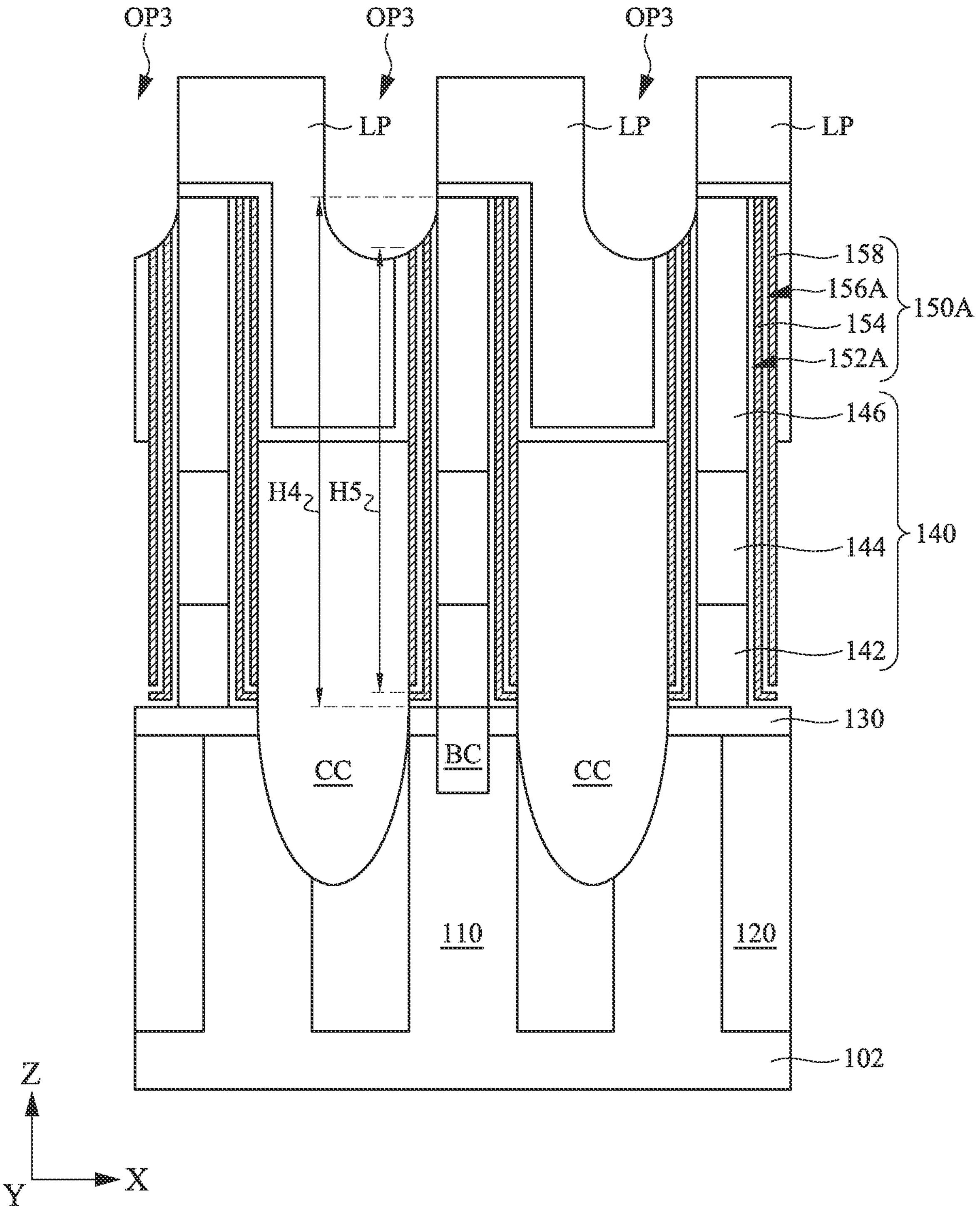
Figure 16:
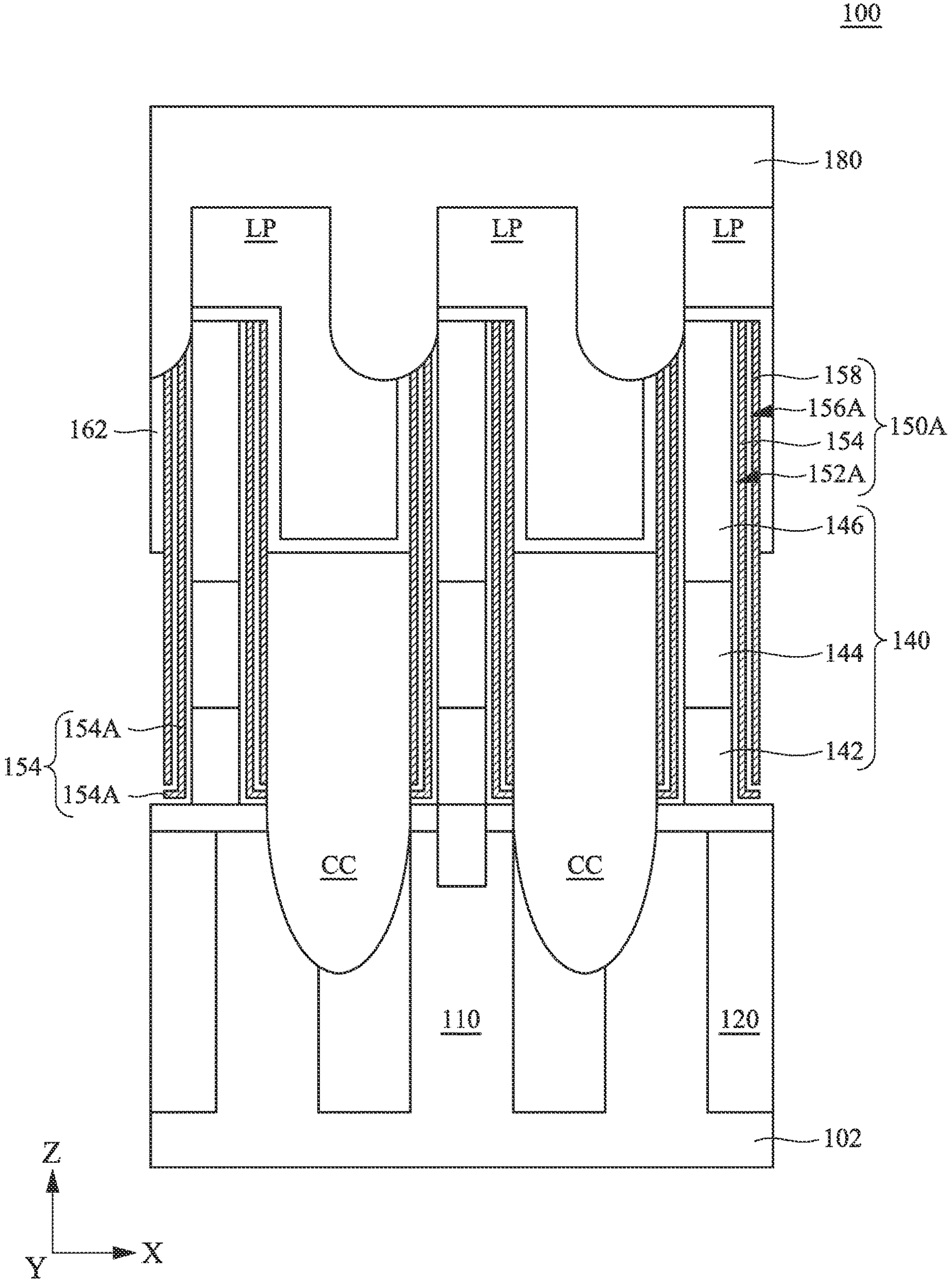

Further, please refer to FIGS. 13-16. FIGS. 13-16 are views of a method of manufacturing a semiconductor structure 100 during forming a plurality of landing pads LP according some embodiments of the present disclosure, wherein FIG. 11 is a top view of a semiconductor structure 100 with the landing pads LP according some embodiments of the present disclosure, and FIGS. 14-16 are cross-sectional views taken along a section-line NN' of FIG. 13 during one of forming the landing pads LP according some embodiments of the present disclosure, respectively.

Please refer to FIG. 14. A fourth conductive material layer 170 is formed on the second barrier layer 162 and covers each of the bit line structures 140 and the cell contacts CC. In some embodiments, the fourth conductive material layer 170 may include conductive materials, such as tungsten, copper, aluminum, alloys, or other suitable conductive materials. In some embodiments, the fourth conductive material layer 170 may be formed by a blanket deposition.

Next, referring to FIG. 15, the plurality of landing pads LP and a plurality of third openings OP3 are formed on each of the bit line structures 140 and a side of the each of the bit line structures 140, respectively. More specifically, a portion of the fourth conductive material layer 170 is removed to form the plurality of landing pads LP and a plurality of third openings OP3. In some embodiments, the portion of the fourth conductive material layer 170 is removed by an etching process. Each of the landing pads LP is formed between and on the adjacent bit line structures 140. As well, each of the third openings OP3 is formed adjacent to each of the landing pads LP. Moreover, a portion of the second barrier layer 162 and a portion of the double-air-gap spacer 150A are removed during the etching process. In some embodiments, after forming the third openings OP3, the first nitride layer 154 of the double-air-gap spacer 150A has a fourth height H4, and the second nitride layer 158 of the double-air-gap spacer 150A has a fifth height H5. In some embodiments, the fourth height H4 is greater than the fifth height H5. Moreover, due to the present of the second barrier layer 162, the material diffusion of the landing pads LP may be reduced. As well, the number of the third openings OP3 illustrated in FIG. 15 is 3 and the number of the landing pads LP illustrated in FIG. 15 is 3, but the present disclosure is not limited thereto.

Further, please refer to FIG. 16. A sealing layer 180 is filled in the third openings OP3 and on each of the landing pads LP. Specifically, the sealing layer 180 contacts each of the landing pads LP, the portion of the second barrier layer 162 and the portion of the double-air-gap spacer 150A. The sealing layer 180 may be formed by CVD, ALD, PVD, other suitable deposition techniques or a combination thereof. In some embodiments, the sealing layer 180 is formed by ALD to avoid a void formation. The sealing layer 180 may include any suitable dielectric material, such as silicon oxide or silicon nitride.

As shown in FIG. 16, after forming the sealing layer 180, the first air gap has a fourth height H4 in the vertical direction (such as in Z direction), and the second air gap has a fifth height H5 in the vertical direction (such as in Z direction). Further described, the fourth height H4 is measured form a surface of the sealing layer 180 against the first air gap 152A to a top surface of the first barrier layer 130, and the fifth height H5 is measured from a surface of the sealing layer 180 against the second air gap 156A to a top surface of the lateral portion 154B of the first nitride layer 154. Also, the fourth height H4 is greater than the fifth height H5.

Via the method of manufacturing the semiconductor structure 100 provided by the embodiments of the present disclosure, the semiconductor structure 100 containing the bit line structure 140 with the double-air-gap spacer 150A can be obtained. The dielectric constant of air is about 1. Thus, the semiconductor structure 100 introduced with the double-air-gap spacer 150A provided by the manufacturing method of this disclosure can reduce the parasitic capacitance between the conductive layer and the cell contact CC, so as to improve the performance of the semiconductor structure. Besides, the first oxide layer 152 and the second oxide layer 156 is removed in the same step, so that the method of manufacturing the semiconductor structure 100 of this disclosure is quite efficient.

Figure 17:
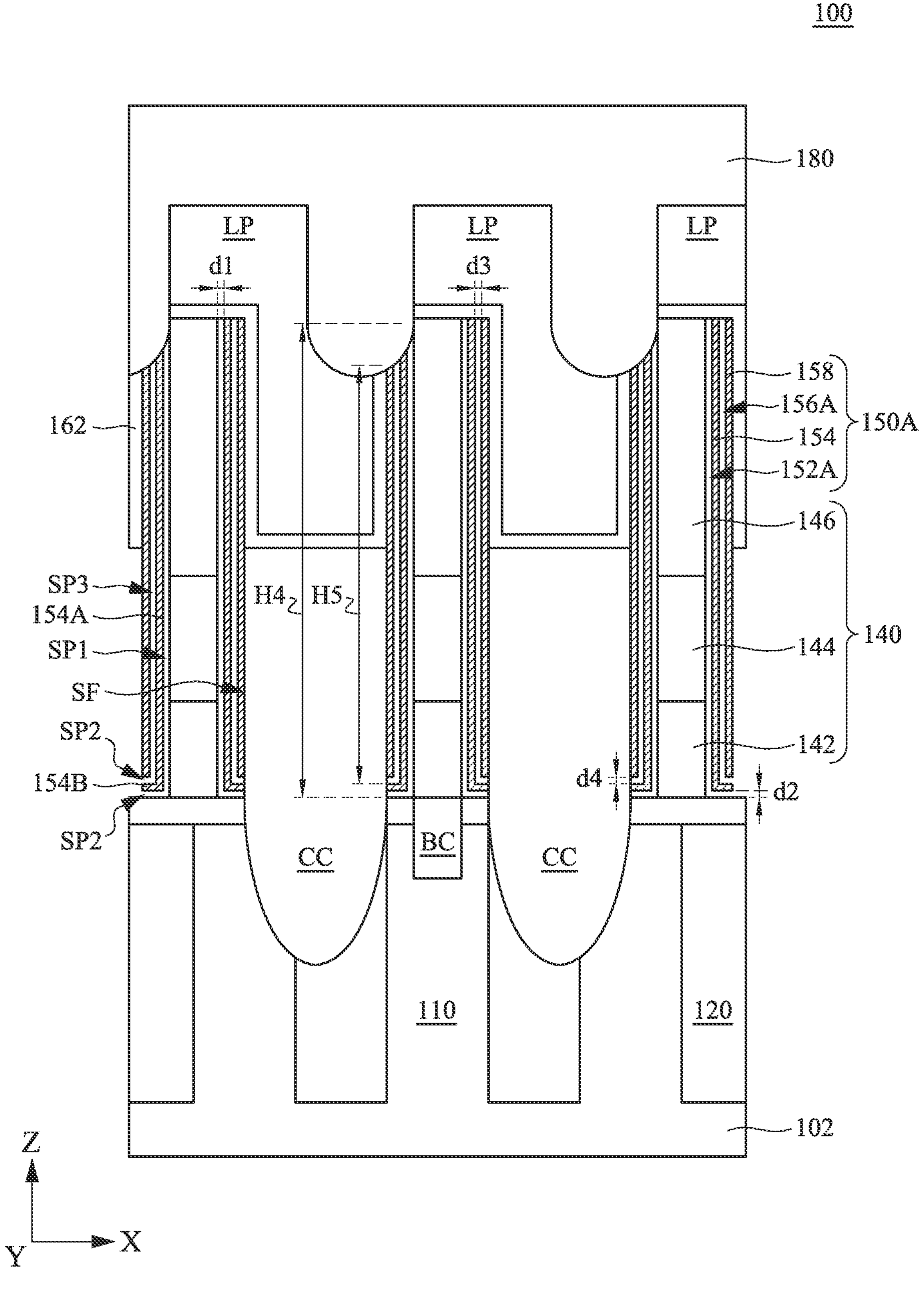
FIG. 17 is a schematic diagram of a semiconductor structure according to some embodiments of the present disclosure.

Furthermore, there are some technical features of the semiconductor structure 100 with the double-air-gap spacer 150A. Please refer to FIG. 17. FIG. 17 is a schematic diagram of a semiconductor structure 100 according to some embodiments of the present disclosure.

As shown in FIG. 17, the semiconductor structure 100 is provided by embodiments of the present disclosure. The semiconductor structure 100 includes the substrate 102, the bit line structures 140 and the spacer 150A. The bit line structures 140 are disposed on and protruding from the substrate 102. The spacer 150A is disposed surrounding the sidewall of each of the bit line structures 140. Besides, the spacer 150A is a double-air-gap spacer 150A, and the spacer 150A comprises the first air gap 152A, the first nitride layer 154, the second air gap 156A and the second nitride layer 158 arranged outward in sequence from each of the bit line structures 140. The first nitride layer 154 includes the vertical portion 154A and the lateral portion 154B. It should be mentioned that the dielectric constant of air is about 1, so that the semiconductor structure 100 with the bit line structures 140 introduced with the first air gap 152A and the second air gap 156A can minimize the parasitic capacitance between the bit line structures 140 and the cell contacts CC.

Further, the substrate 102 includes the plurality of active areas 110 and the insulation areas 120 between the active areas 110. The semiconductor structure 100 includes the first barrier layer 130 on the substrate 102 and covers the portion of each of the active areas 110 and the insulation areas 120. Moreover, the semiconductor structure 100 includes the bit line contact BC disposed in the first barrier layer 130. The bit line contact BC is disposed under each of the plurality of bit line structures 140 and passes through the first barrier layer 130 and each of the active areas 110 to contact each of the active areas 110, so that the bit line contact BC is electrically connected to each of the active areas 110.

Furthermore, each of the bit line structures 140 includes the bottom cap layer 142, the conductive layer 144 and the top cap layer 146. The bottom cap layer 142 is disposed on the first barrier layer 130 and contacts the bit line contact BC. The conductive layer 144 is disposed on the bottom cap layer 142. The top cap layer 146 is disposed on the conductive layer 144. Moreover, the material of the bottom cap layer 142 and the top cap layer 146 is the insulation material, and the insulation material of the bottom cap layer 142 and the top cap layer 146 is the same or different. In some embodiments, the insulation material includes a dielectric material, such as silicon nitride, but the present disclosure is not limited thereto. In some embodiments, the material of the conductive layer 144 may be at least one of doped semiconductor, metal, conductive metal nitride and metal silicide. In some embodiments, the conductive layer may have a stacked structure. For example, the material of the conductive layer 144 may be a stack structure composed of doped polysilicon and metal nitride or metal (such as tungsten, tungsten nitride and/or titanium nitride). The conductive layer 144 can be electrically connected to the bit line contact BC.

Further, the first air gap 152A of the double-air-gap spacer 150A includes the first space SP1 and the second space SP2. Specifically, the first space SP1 is disposed between the vertical portion 154A of the first nitride layer 154 and the first air gap, and there is the first distance d1 between the vertical portion 154A of the first nitride layer 154 and the first air gap 152A. The second space SP2 is disposed between the lateral portion 154B of the first nitride layer 154 and the first barrier layer 130, and there is the second distance d2 between the lateral portion 154B of the first nitride layer 154 and the first barrier layer 130. Moreover, the first distance d1 is a lateral distance (such as in X direction and Y direction), while the second distance d2 is a vertical distance (such as in Z direction). The first distance d1 is associated with the second distance d2. For example, the first distance d1 is equivalent to the second distance d2. In addition, the second air gap 156A of the double-air-gap spacer 150A includes the third space SP3 and the fourth space SP4. The third space SP3 is disposed between the vertical portion 154A of the first nitride layer 154 and the second nitride layer 158, and there is the third distance d3 between the vertical portion 154A of the first nitride layer 154 and the second nitride layer 158. The fourth space SP4 is disposed between the second nitride layer 158 and the lateral portion 154B of the first nitride layer 154, and there is the fourth distance d4 between the second nitride layer 158 and the lateral portion 154B of the first nitride layer 154. Also, the third distance d3 is associated with the fourth distance d4. For example, the third distance d3 is equivalent to the fourth distance d4. Moreover, the third distance d3 is a lateral distance (such as in X direction and Y direction), while the fourth distance d4 is a vertical distance (such as in Z direction).

Next, the semiconductor structure 100 includes the cell contact CC between the adjacent bit line structures 140. The cell contact CC is disposed on opposite sides of the conductive layer 144 of each of the bit line structures 140, and the cell contact CC passes through the first barrier layer 130 and the substrate 102 to be electrically connected to the active areas 110. As well, an upper sidewall of the cell contact CC contacts a side surface SF of the second nitride layer 158. More specifically, the upper sidewall of the cell contact CC contacts a lower portion of the side surface SF of the second nitride layer 158.

In addition, the semiconductor structure 100 includes the second barrier layer 162 covering the upper portion of the bit line structures 140. Also, the second barrier layer 162 is disposed on the top surface of the cell contact CC. More specifically, the second barrier layer 162 is disposed surrounding the double-air-gap spacer 150A.

Further, the semiconductor structure 100 includes the plurality of landing pads LP between and on each of the bit line structures 140. Also, the landing pads LP are disposed on the second barrier layer 162. Due to the present of the second barrier layer 162, the material diffusion of the landing pads LP may be reduced. In some embodiments, each of the landing pads LP surrounds a part of the upper portion of each of the bit line structures 140 with the double-air-gap spacer 150A.

Furthermore, the semiconductor structure 100 includes the sealing layer 180 on the landing pads. More specifically, the sealing layer 180 is disposed on the landing pads LP, the second barrier layer 162 and the double-air-gap spacer 150A. Besides, the material of the sealing layer 180 is may include any suitable dielectric material, such as silicon oxide or silicon nitride. After forming the sealing layer 180, the first air gap has a fourth height H4 in the vertical direction (such as in Z direction), and the second air gap has a fifth height H5 in the vertical direction (such as in Z direction). Further described, the fourth height H4 is measured form a surface of the sealing layer 180 against the first air gap 152A to a top surface of the first barrier layer 130, and the fifth height H5 is measured from a surface of the sealing layer 180 against the second air gap 156A to a top surface of the lateral portion 154B of the first nitride layer 154. Also, the fourth height H4 is greater than the fifth height H5.

Figure 18:
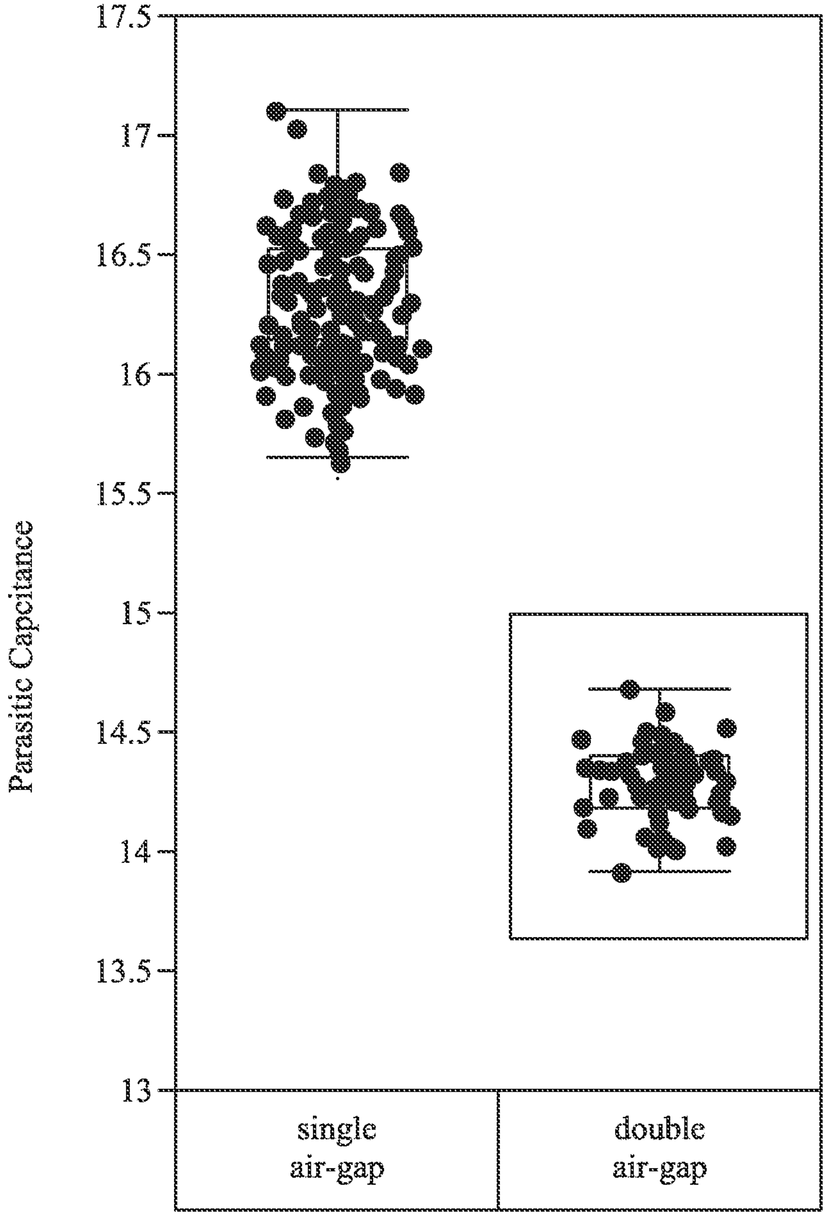
FIG. 18 is a comparison diagram of the parasitic capacitance of a semiconductor structure with single air-gap and the semiconductor structure with double air-gap according to some embodiments of the present disclosure.

Further, please refer to FIG. 18. FIG. 18 is a comparison diagram of the parasitic capacitance of a semiconductor structure with a single air-gap and the semiconductor structure with a double air-gap according to some embodiments of the present disclosure. As shown in FIG. 18, compared with the semiconductor with the semiconductor structure with the single air-gap, the parasitic capacitance between the bit line structure 140 and the cell contact CC of the semiconductor structure 100 with the double-air-gap spacer 150A is reduced about 13.6%. As a result, the semiconductor structure 100 with the double-air-gap spacer 150A can minimize the parasitic capacitance between the bit line structure 140 and the cell contact CC, which can upgrade the operation speed of the semiconductor structure 100.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
- a substrate, comprising a plurality of active areas and a plurality of insulation areas between the active areas;
- a first barrier layer, disposed on the substrate;
- a plurality of bit line structures, disposed on the first barrier layer and protruding from the substrate;
- a spacer, disposed surrounding a sidewall of each of the plurality of bit line structures, wherein the spacer comprises a first air gap, a first nitride layer, a second air gap and a second nitride layer arranged outward in sequence from each of the bit line structures, wherein the first air gap comprises:
- a first space disposed between a vertical portion of the first nitride layer and the first air gap in a lateral direction; and
- a second space disposed between a lateral portion of the first nitride layer and the first barrier layer in a vertical direction; and
- a plurality of landing pads, disposed over the plurality of bit line structures with the spacer.

2. The semiconductor structure of claim 1, wherein the first space has a first distance, and the second space has a second distance, and the first distance is equivalent to the second distance.

3. The semiconductor structure of claim 1, wherein the second air gap comprises a third space and a fourth space, and the third space is disposed between a vertical portion of the first nitride layer and the second nitride layer in a lateral direction, and the fourth space is disposed between the second nitride layer and a lateral portion of the first nitride layer in a vertical direction.

4. The semiconductor structure of claim 3, wherein the third space has a third distance, and the fourth space has a fourth distance, and the third distance is equivalent to the fourth distance.

5. The semiconductor structure according to claim 1, wherein each of the plurality of bit line structures comprises:

a bottom cap layer, disposed over the substrate;

a conductive layer, disposed on the bottom cap layer; and a top cap layer, disposed on the conductive layer.

6. The semiconductor structure according to claim 5, wherein the bottom cap layer has a first height, the conductive layer has a second height, and the top cap layer has a third height, and the third height is greater than the second height, and the second height is greater than the first height.

7. The semiconductor structure of claim 1, further comprising:

a sealing layer, disposed on the landing pads and the spacer.

* * * * *